(12) United States Patent
Tsutsui et al.

(10) Patent No.: US 11,018,639 B2
(45) Date of Patent: May 25, 2021

(54) POWER AMPLIFIER CIRCUIT

(71) Applicant: Murata Manufacturing Co., Ltd., Kyoto (JP)

(72) Inventors: Takayuki Tsutsui, Kyoto (JP); Masao Kondo, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 55 days.

(21) Appl. No.: 16/382,324

(22) Filed: Apr. 12, 2019

(65) Prior Publication Data

US 2019/0356288 A1 Nov. 21, 2019

(30) Foreign Application Priority Data

May 21, 2018 (JP) .............................. JP2018-097267

(51) Int. Cl.
| | |
|---|---|
| *H03F 1/30* | (2006.01) |
| *H03F 3/24* | (2006.01) |
| *H03F 3/21* | (2006.01) |
| *H03F 3/19* | (2006.01) |
| *H03F 3/193* | (2006.01) |
| *H03F 3/04* | (2006.01) |

(52) U.S. Cl.
CPC ............. *H03F 3/245* (2013.01); *H03F 1/301* (2013.01); *H03F 1/302* (2013.01); *H03F 3/04* (2013.01); *H03F 3/19* (2013.01); *H03F 3/193* (2013.01); *H03F 3/21* (2013.01)

(58) Field of Classification Search
CPC ... H03F 3/245; H03F 3/21; H03F 3/19; H03F 1/0266; H03F 1/0261; H03F 2200/411; H03F 2200/451; H03F 1/56; H03F 1/0211; H03F 1/302
USPC ......................... 330/296, 285, 133, 210, 302
See application file for complete search history.

(56) References Cited

U.S. PATENT DOCUMENTS

| | | | |
|---|---|---|---|
| 6,842,072 B1 | 1/2005 | Cheng et al. | |
| 7,091,790 B2 * | 8/2006 | Doherty | .................... H03F 1/02 330/291 |
| 2017/0353162 A1 | 12/2017 | Honda | |

FOREIGN PATENT DOCUMENTS

JP 2017-92526 A 5/2017

* cited by examiner

*Primary Examiner* — Khanh V Nguyen
*Assistant Examiner* — Khiem D Nguyen
(74) *Attorney, Agent, or Firm* — Pearne & Gordon LLP

(57) ABSTRACT

A power amplifier circuit includes a first transistor that amplifies a first signal and outputs a second signal; a second transistor that amplifies the second signal and outputs a third signal; a bias circuit that supplies a bias current to a base of the second transistor; and a bias adjustment circuit that adjusts the bias current to be supplied by the bias circuit by subjecting the first signal to detection. The bias adjustment circuit controls the bias current to be supplied to the base of the second transistor by drawing, from the bias circuit, a current of a magnitude corresponding to a magnitude of the first signal. The current increases as the magnitude of the first signal increases.

14 Claims, 7 Drawing Sheets

POWER AMPLIFIER CIRCUIT

This application claims priority from Japanese Patent Application No. 2018-097267 filed on May 21, 2018. The content of this application is incorporated herein by reference in its entirety.

BACKGROUND OF THE DISCLOSURE

1. Field of the Disclosure

The present disclosure relates to a power amplifier circuit.

2. Description of the Related Art

In mobile communication terminals, such as cellular phones, a power amplifier circuit is used that amplifies a radio frequency (RF) signal to be transmitted to a base station. The power amplifier circuit includes a transistor that amplifies the RF signal, and a bias circuit that supplies a bias current to the transistor. For example, Japanese Unexamined Patent Application Publication No. 2017-92526 discloses a bipolar transistor TrRF1 that amplifies an input signal RFin, a bipolar transistor TrRF2 that amplifies the amplified signal RFoutl amplified by the bipolar transistor TrRF1, and a bias circuit 200D that supplies a bias current to a base of the bipolar transistor TrRF2.

However, when the output power of a power amplifier circuit increases, a phase of an output signal varies in accordance with the transistor characteristics, and the linearity of the phase deteriorates in some cases.

BRIEF SUMMARY OF THE DISCLOSURE

The present disclosure has been made in view of such circumstances and provides a power amplifier circuit that improves the linearity of a phase of an output signal.

One preferred embodiment of the present disclosure is directed to a power amplifier circuit that includes a first transistor configured to amplify a first signal and output a second signal; a second transistor configured to amplify the second signal and output a third signal; a bias circuit configured to supply a bias current to a base of the second transistor; and a bias adjustment circuit configured to adjust the bias current to be supplied by the bias circuit by subjecting the first signal to detection. The bias adjustment circuit controls the bias current to be supplied to the base of the second transistor by drawing, from the bias circuit, a current of a magnitude corresponding to a magnitude of the first signal. The current increases as the magnitude of the first signal increases.

Preferred embodiments of the present disclosure can provide the power amplifier circuit that improves the linearity of a phase of an output signal.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
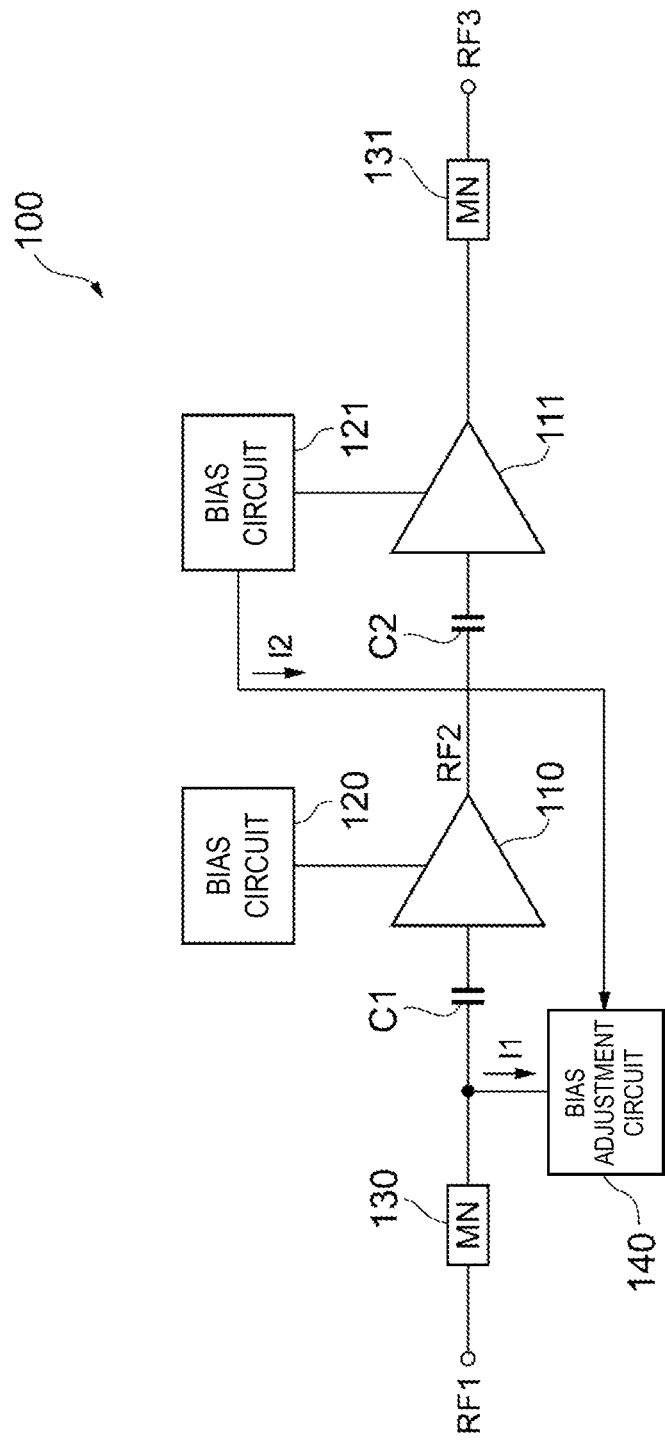
FIG. 1 illustrates an overview of a configuration of a power amplifier circuit according to a first embodiment of the present disclosure.

An embodiment of the present disclosure will be described in detail below with reference to the drawings. The same elements are designated by the same reference numerals, and the repeated descriptions thereof are omitted.

(1) Entire Configuration

FIG. 1 illustrates an overview of a configuration of a power amplifier circuit according to a first embodiment of the present disclosure. A power amplifier circuit 100 illustrated in FIG. 1 is a circuit that is installed in, for example, a mobile communication device, such as a cellular phone, and that amplifies the power of a radio frequency (RF) signal to a level necessary to transmit the signal to a base station. The power amplifier circuit 100 amplifies a transmission signal of a communication standard, such as the second generation mobile communication system (2G), the third generation mobile communication system (3G), the fourth generation mobile communication system (4G), the fifth generation mobile communication system (5G), long term evolution (LTE)-frequency division duplex (FDD), LTE-time division duplex (TDD), LTE-Advanced, or LTE-Advanced Pro. The frequency of an RF signal ranges from about several hundred MHz to several tens of GHz, for example. The communication standard and frequency of a signal to be amplified by the power amplifier circuit 100 are not limited to these.

Specifically, the power amplifier circuit 100 includes, for example, amplifiers 110 and 111, bias circuits 120 and 121, matching networks 130 and 131, a bias adjustment circuit 140, and capacitors C1 and C2.

Each of the amplifiers 110 and 111 amplifies an input RF signal and outputs the amplified RF signal. That is, the power amplifier circuit 100 amplifies power in two stages. Specifically, the first-stage (driver-stage) amplifier 110 amplifies an RF signal RF1 (first signal) inputted from an input terminal through the matching network 130 and outputs an RF signal RF2 (second signal). The subsequent-stage (power-stage) amplifier 111 amplifies the RF signal RF2 (second signal) supplied from the amplifier 110 and outputs an RF signal RF3 (third signal). Each of the amplifiers 110 and 111 is constituted by, for example, a bipolar transistor, such as a heterojunction bipolar transistor (HBT), made of a compound semiconductor of gallium arsenide (GaAs) or the like. As each of the amplifiers 110 and 111 and the bias circuit 121 to be described, a field-effect transistor (FET) may be used instead of the bipolar transistor.

The bias circuits 120 and 121 supply a bias current or a bias voltage to the respective amplifiers 110 and 111. The bias circuits 120 and 121 may adjust a bias current or a bias voltage to thereby control the gains of the amplifiers 110 and 111.

The matching network (MN) 130 matches the impedance of a circuit (not illustrated) provided at a previous stage to that of the amplifier 110. The matching network 131 matches the impedance of the amplifier 111 to that of a circuit (not illustrated) provided at a subsequent stage. Although omitted in FIG. 1, the power amplifier circuit 100 may include an interstage matching network between the amplifier 110 and the amplifier 111.

The bias adjustment circuit 140 is a circuit that adjusts a bias current or a bias voltage to be supplied to the amplifier 111 by the bias circuit 121 by subjecting an RF input separated from the RF signal RF1 to detection. The bias adjustment circuit 140 is used to improve the linearity of a phase of an output signal of the power amplifier circuit 100 when the output power of the power amplifier circuit 100 is relatively high. That is, in a typical power amplifier circuit, when the output power exceeds a certain level, a phase of an output signal can vary widely in accordance with the performance of a transistor. To deal with this issue, in the power amplifier circuit 100, a current corresponding to the magnitude of the RF signal RF1 is drawn from the bias circuit 121, and a bias current to be supplied from the bias circuit 121 to the amplifier 111 is controlled, and the phase of the output signal is thereby controlled.

The capacitors C1 and C2 are provided at inputs of the respective amplifiers 110 and 111. Each of the capacitors C1 and C2 is a direct current (DC) cut capacitor that blocks a direct-current component included in an RF signal and allows an alternating-current component to pass.

(2) Configuration of Each Element

Figure 2:
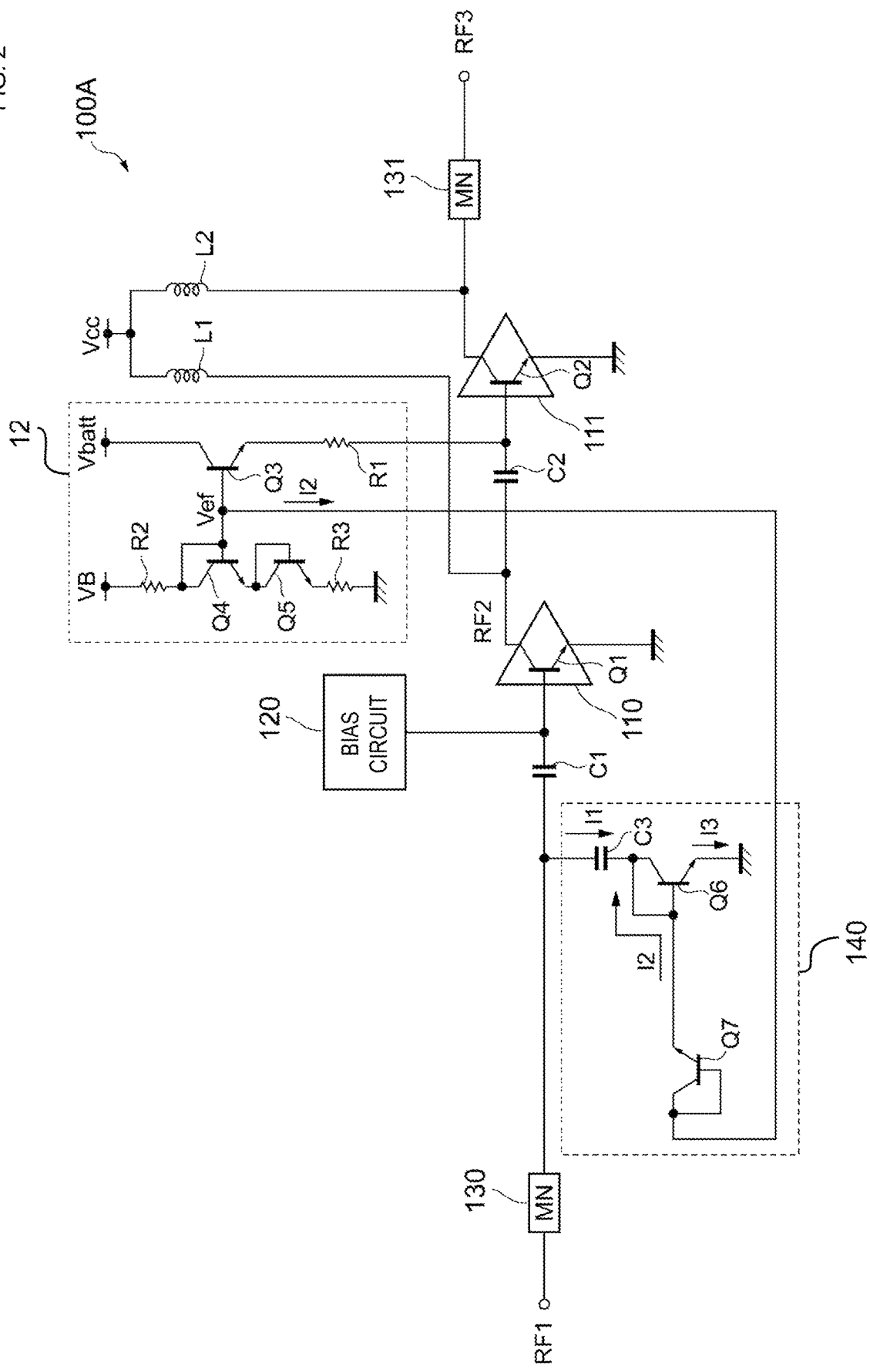
FIG. 2 illustrates an example of a configuration of a power amplifier circuit according to the first embodiment of the present disclosure.

FIG. 2 illustrates an example of a configuration of a power amplifier circuit 100A according to the first embodiment of the present disclosure. In the power amplifier circuit 100A illustrated in FIG. 2, the specific configurations of the bias circuit 121 and the bias adjustment circuit 140 in particular of the power amplifier circuit 100 illustrated in FIG. 1 are illustrated.

(2-1) Amplifier

The amplifiers 110 and 111 include respective transistors Q1 and Q2. With respect to the transistor Q1 (first transistor), a power-supply voltage Vcc is supplied to a collector through an inductor L1, the RF signal RF1 and a bias current are supplied to a base, and an emitter is connected to the ground. Thus, the transistor Q1 outputs, from the collector, the RF signal RF2 obtained by amplifying the RF signal RF1. With respect to the transistor Q2 (second transistor), the power-supply voltage Vcc is supplied to a collector through an inductor L2, the RF signal RF2 and a bias current are supplied to a base, and an emitter is connected to the ground. Thus, the transistor Q2 outputs, from the collector, the RF signal RF3 obtained by amplifying the RF signal RF2.

With respect to the inductors L1 and L2, the power-supply voltage Vcc is supplied to one ends, and the other ends are connected to the collectors of the respective transistors Q1 and Q2. Each of the inductors L1 and L2 is a choke inductor for inhibiting an alternating-current component from leaking to a power-supply voltage Vcc side.

(2-2) Bias Circuit

The bias circuit 121 includes, for example, transistors Q3 to Q5, and resistance elements R1 to R3. The configuration of the first-stage bias circuit 120 can be regarded as similar to the configuration of the subsequent-stage bias circuit 121, and thus a detailed description thereof is omitted. The configurations of the bias circuits 120 and 121 are examples, and thus each of the bias circuits 120 and 121 may be a bias circuit having a current mirror configuration or another configuration.

With respect to the transistor Q3 (third transistor), a battery voltage Vbatt is supplied to a collector, a base is connected to a base of the transistor Q4, and an emitter is connected to the base of the transistor Q2 through the resistance element R1. Furthermore, as described later, the base of the transistor Q3 is connected to the bias adjustment circuit 140. Incidentally, a voltage to be supplied to the collector of the transistor Q3 is not limited to the battery voltage Vbatt, and a desired voltage only has to be supplied.

With respect to the transistor Q4, a collector and the base are connected (hereinafter this type of connection is referred to as "diode connected"), a bias control voltage VB is supplied to the collector through the resistance element R2 (first resistance element), and an emitter is connected to a collector of the transistor Q5. With respect to the transistor Q5, the transistor Q5 is diode connected, the collector is connected to the emitter of the transistor Q4, and an emitter is connected to the ground through the resistance element R3. Thus, a voltage of a predetermined level (for example, about 2.7 V) is generated at the collector of the transistor Q4. Each of the transistors Q4 and Q5 may be constituted by a diode in place of a transistor. In this case, the collector (or base) and the emitter are to be regarded as an anode and a cathode, respectively. The same is true for a diode-connected transistor to be described.

With respect to the resistance element R1, one end is connected to the emitter of the transistor Q3, and the other end is connected to the base of the transistor Q2. The resistance element R1 suppresses an increase in bias current accompanying an increase in local temperature in particular of the transistor Q2. With respect to the resistance element R2, the bias control voltage VB is supplied to one end, and the other end is connected to the collector of the transistor Q4. With respect to the resistance element R3, one end is connected to the emitter of the transistor Q5, and the other end is connected to the ground.

In the above-described configuration, the transistor Q3 supplies a bias current from the emitter to the base of the transistor Q2. The bias circuit 121 does not have to include the resistance elements R1 to R3.

(2-3) Bias Adjustment Circuit

The bias adjustment circuit 140 includes transistors Q6 and Q7, and a capacitor C3.

The transistor Q6 (fourth transistor) is diode connected and constitutes a first diode. With respect to the transistor Q6, a collector is connected, through the capacitor C3, to a side on which a supply path of the RF signal RF1 to the transistor Q1 is disposed, a base is connected to an emitter of the transistor Q7, and an emitter is connected to the ground.

With respect to the capacitor C3, one end is connected to the supply path of the RF signal RF1 to the transistor Q1, and the other end is connected to the collector of the transistor Q6. The capacitor C3 inhibits a direct-current component at the collector of the transistor Q6 from being supplied to the supply path of the RF signal RF1 to the transistor Q1.

The transistor Q7 (fifth transistor) is diode connected and constitutes a second diode. A collector of the transistor Q7 is connected to the bases of the transistors Q3 and Q4 of the bias circuit 121. The emitter of the transistor Q7 is connected to the base and the collector of the transistor Q6. The transistor Q7 is provided to inhibit the backflow of a current flowing from the bias circuit 121 to the transistor Q6. Hence, the transistor Q7 does not have to be a transistor and may be a diode.

The transistors Q6 and Q7 may be formed on the same semiconductor substrate. Here, the effect of improving the linearity of a phase of an output signal achieved by the power amplifier circuit 100A to be described increases as the sizes of emitters of transistors in which the respective transistors Q6 and Q7 are formed decrease. The sizes of the emitters of the transistors in which the respective transistors Q6 and Q7 are formed may be about 2×2 μm or may be smaller than about 2×2 μm, for example.

(3) Operating Principle

Next, an operating principle of the power amplifier circuit 100A will be described with reference to FIGS. 2 to 5.

An average current that flows into the collector of the transistor Q6 from the side on which the supply path of the RF signal RF1 to the transistor Q1 is disposed is denoted by I1. An average current that flows into the collector of the transistor Q6 from the emitter of the transistor Q7 is denoted by I2. Of a current that flows from a power supply of the bias control voltage VB through the resistance element R2 and flows from the collector of the transistor Q4 to the base of the transistor Q4, part serves as a base current of the transistor Q3, and the other part flows to the bias adjustment circuit 140. The other part of the current serves as the average current I2 described above. Furthermore, an average current that flows out of the emitter of the transistor Q6 is denoted by I3. At this time, the equation I3=I1+I2 holds.

When a voltage value of the RF signal RF1 is not less than a predetermined threshold value, the transistor Q6 serving as the first diode is turned on, and a collector-emitter current flows. A current value of the collector-emitter current increases as the voltage value of the RF signal RF1 increases. As a result, when a power level of the RF signal RF1 increases, the average current I3 that flows out of the emitter of the transistor Q6 (a cathode of the first diode) increases. At this time, the average current I1 increases in response to an increase in the average current I3. Of an amount by which the average current I3 increases, an amount not covered by an amount by which the average current I1 increases is covered by the average current I2 drawn from the bias circuit 121. Hence, when the power level of the RF signal RF1 increases, the average current I2 drawn from the bias circuit 121 increases. Thus, as the average current I2 increases, an average current that flows from the bias control voltage VB to the base of the transistor Q4 increases. As a result, when the output power increases, a voltage drop across the resistance element R2 increases, and a base voltage Vef of the transistor Q3 decreases.

Figure 3:
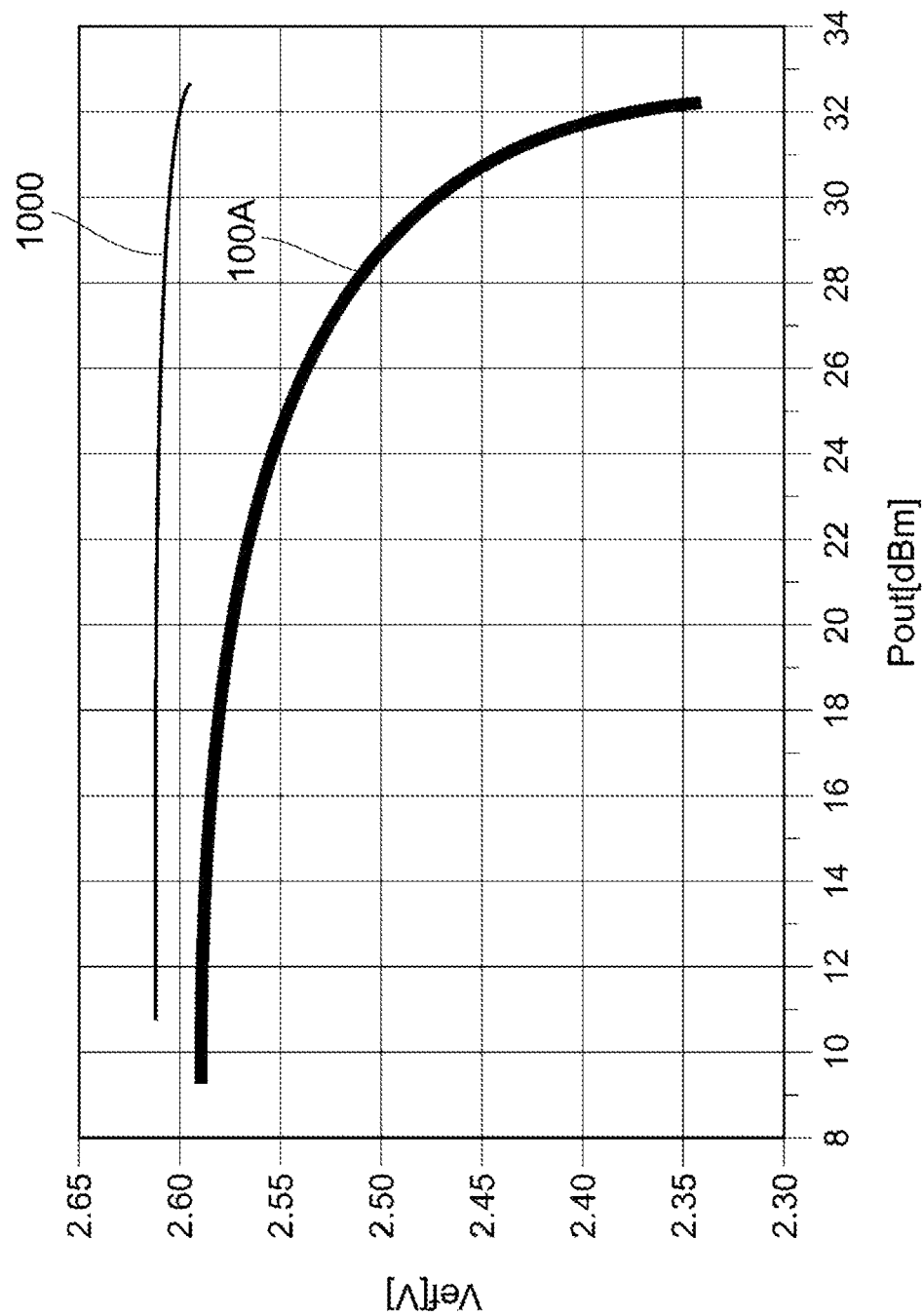
FIG. 3 illustrates a relationship between, in the power amplifier circuit according to the first embodiment, output power, and base voltage of a third transistor.

FIG. 3 illustrates a relationship between, in the power amplifier circuit according to the first embodiment, the output power, and the base voltage of the third transistor. In FIG. 3, the horizontal axis represents output power (dBm) of the power amplifier circuit 100A, and the vertical axis represents base voltage Vef (V) of the transistor Q3. In FIG. 3, a reference numeral 100A denotes the power amplifier circuit 100A, and a reference numeral 1000 denotes a power amplifier circuit 1000 in a comparative example. Here, the power amplifier circuit 1000 in the comparative example does not include the bias adjustment circuit 140, and the supply path of the RF signal RF1 to the amplifier 110 and the bias circuit 121 are not connected to each other. Other configurations of the power amplifier circuit 1000 in the comparative example are similar to those of the power amplifier circuit 100A.

As illustrated in FIG. 3, in the power amplifier circuit 1000 in the comparative example, the base voltage Vef of the transistor Q3 is almost constant at about 2.6 V regardless of the magnitude of the output power. On the other hand, in the power amplifier circuit 100A according to the first embodiment, although the base voltage Vef in a region where the output power is low is on the order of about 2.6 V, the base voltage Vef decreases as the output power increases, and the rate of decrease in the base voltage Vef accompanying an increase in the output power increases in a region where the output power is high. Thus, in the power amplifier circuit 100A, when a level of the output power increases, the average current I2 that the bias adjustment circuit 140 draws from the bias circuit 121 increases, and the base voltage Vef of the transistor Q3 therefore decreases.

Figure 4:
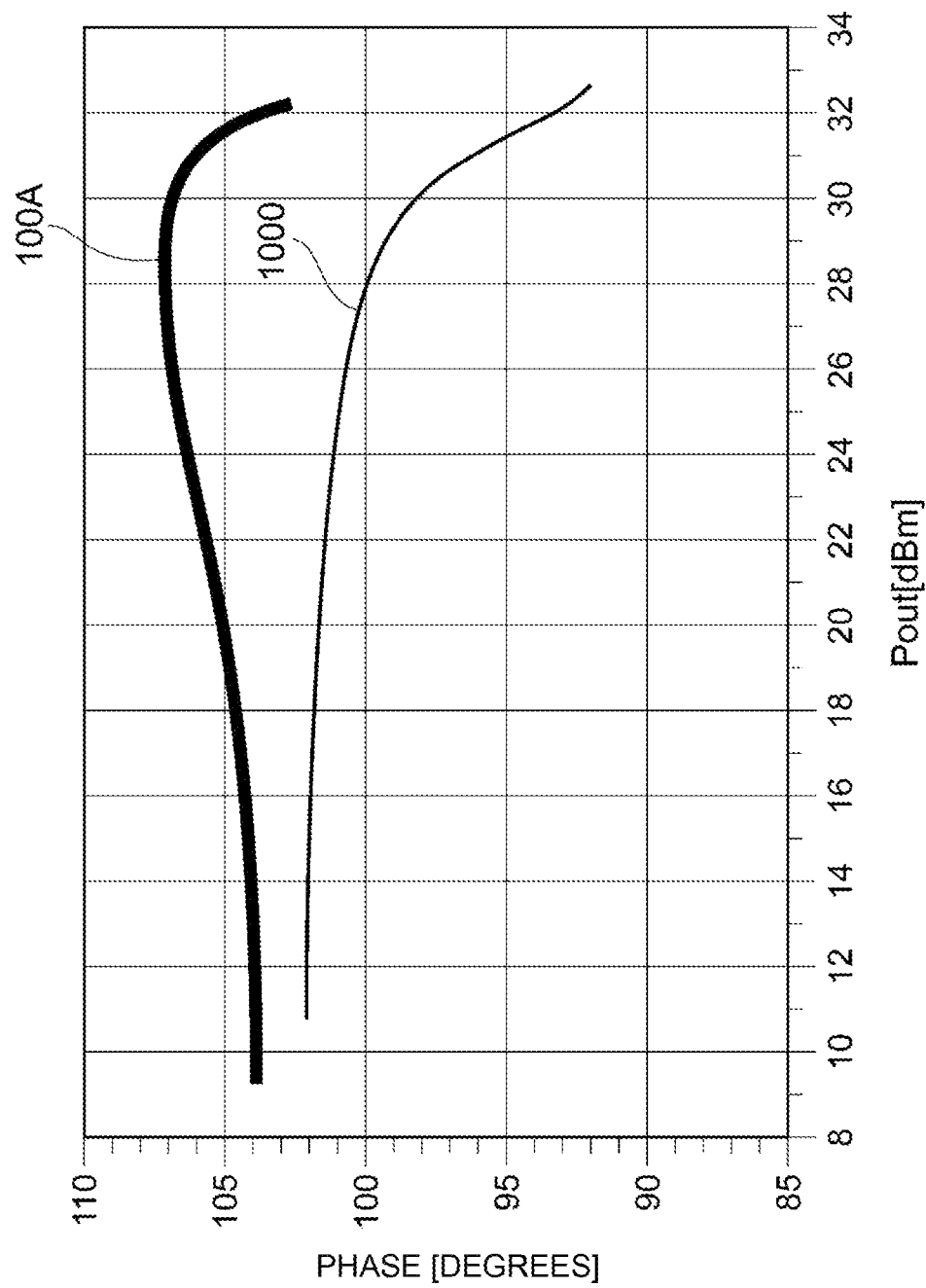
FIG. 4 illustrates a relationship between power and phase of an output signal of the power amplifier circuit according to the first embodiment.

FIG. 4 illustrates a relationship between power and phase of an output signal of the power amplifier circuit according to the first embodiment. In FIG. 4, the horizontal axis represents power (dBm) of an output signal of the power amplifier circuit 100A, and the vertical axis represents phase (degrees) of the output signal (an absolute value of the phase of the RF signal RF3 at an output node). In FIG. 4, a reference numeral 100A denotes the power amplifier circuit 100A, and a reference numeral 1000 denotes the power amplifier circuit 1000 in the comparative example.

As illustrated in FIG. 4, in the power amplifier circuit 1000 in the comparative example, the phase of the output signal decreases gradually as the output power increases, and the phase of the output signal decreases rapidly in a region where the output power is not less than about 28 dBm in particular. On the other hand, in the power amplifier circuit 100A according to the first embodiment, although the phase of the output signal increases gradually as the output power increases, the phase of the output signal reaches a maximum value in the vicinity of an output power of about 28 dBm, and the phase of the output signal decreases gradually when the output power further increases. Subsequently, the phase of the output signal in the vicinity of an output power of about 32 dBm is approximately equal to the phase of the output signal in a region where the output power is low (an output power range of from about 10 to about 20 dBm). Hence, it can be said that, in the power amplifier circuit 100A, the linearity of the phase of the output signal has been improved.

(4) Modifications

Figure 5:
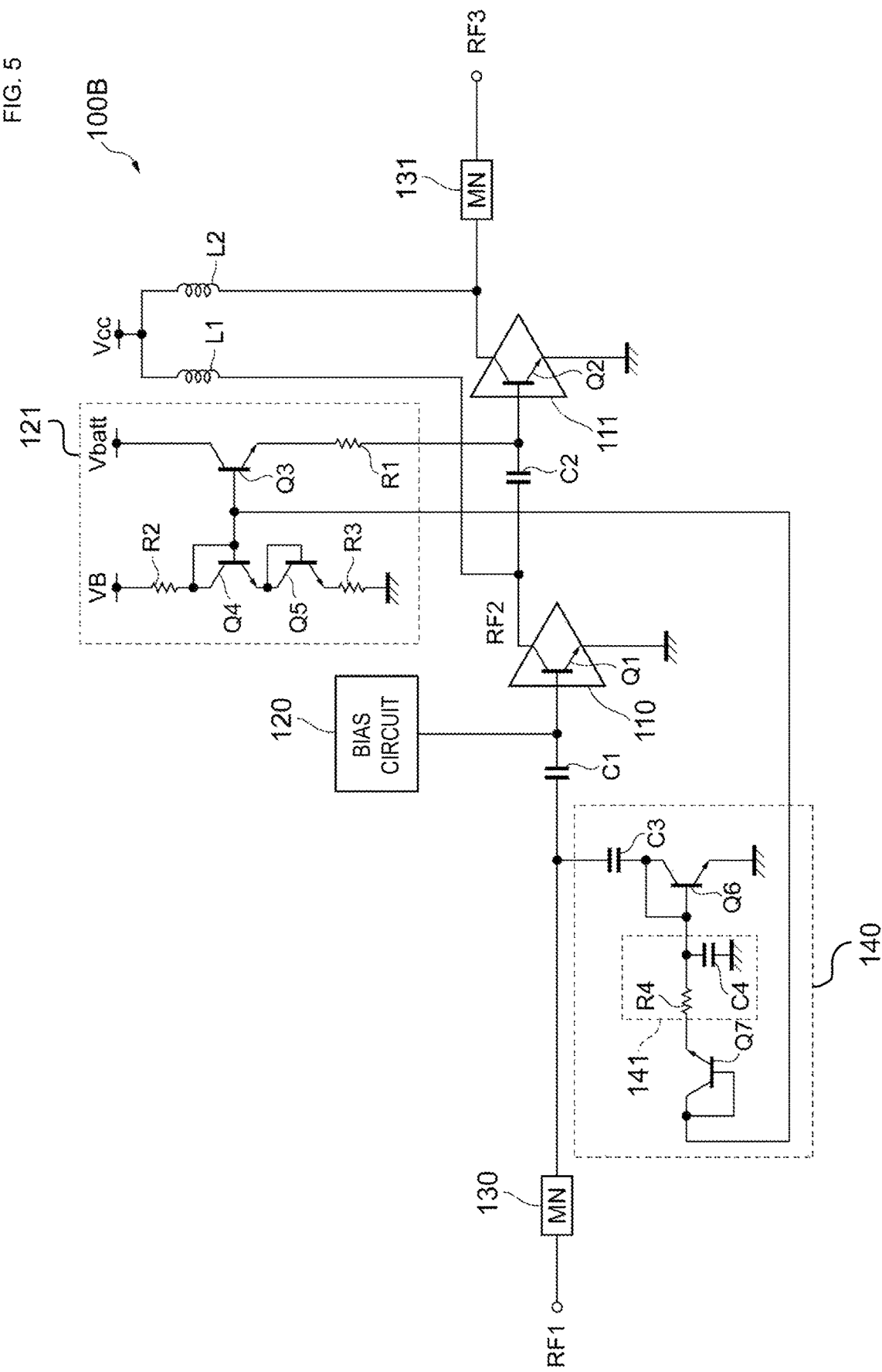
FIG. 5 illustrates an example of a configuration of a modification of the power amplifier circuit according to the first embodiment of the present disclosure.

FIG. 5 illustrates an example of a configuration of a modification of the power amplifier circuit according to the first embodiment of the present disclosure. Hereinafter, a point in which the configuration of a power amplifier circuit 100B serving as a modification differs from the configuration of the power amplifier circuit 100A described above will be described, and a description of a point in which the configuration of the power amplifier circuit 100B is similar to the configuration of the power amplifier circuit 100A is appropriately omitted.

As illustrated in FIG. 5, the bias adjustment circuit 140 included in the power amplifier circuit 100B includes a filter circuit 141. The filter circuit 141 includes a capacitor C4 (first capacitor) and a resistance element R4 (second resistance element). One end of the capacitor C4 is connected to the base of the transistor Q6, and the other end is connected to the ground. One end of the resistance element R4 is connected to the base of the transistor Q6 and to the one end of the capacitor C4, and the other end of the resistance element R4 is connected to the emitter of the transistor Q7.

In the power amplifier circuit 100B, the noise contained in the RF signal RF1 is reduced by the filter circuit 141, and the noise transferred to the bias circuit 121 decreases. In particular, in the case where the first diode is constituted by a diode-connected transistor (for example, the transistor Q6), the effect of reducing the noise is increased.

Figure 6:
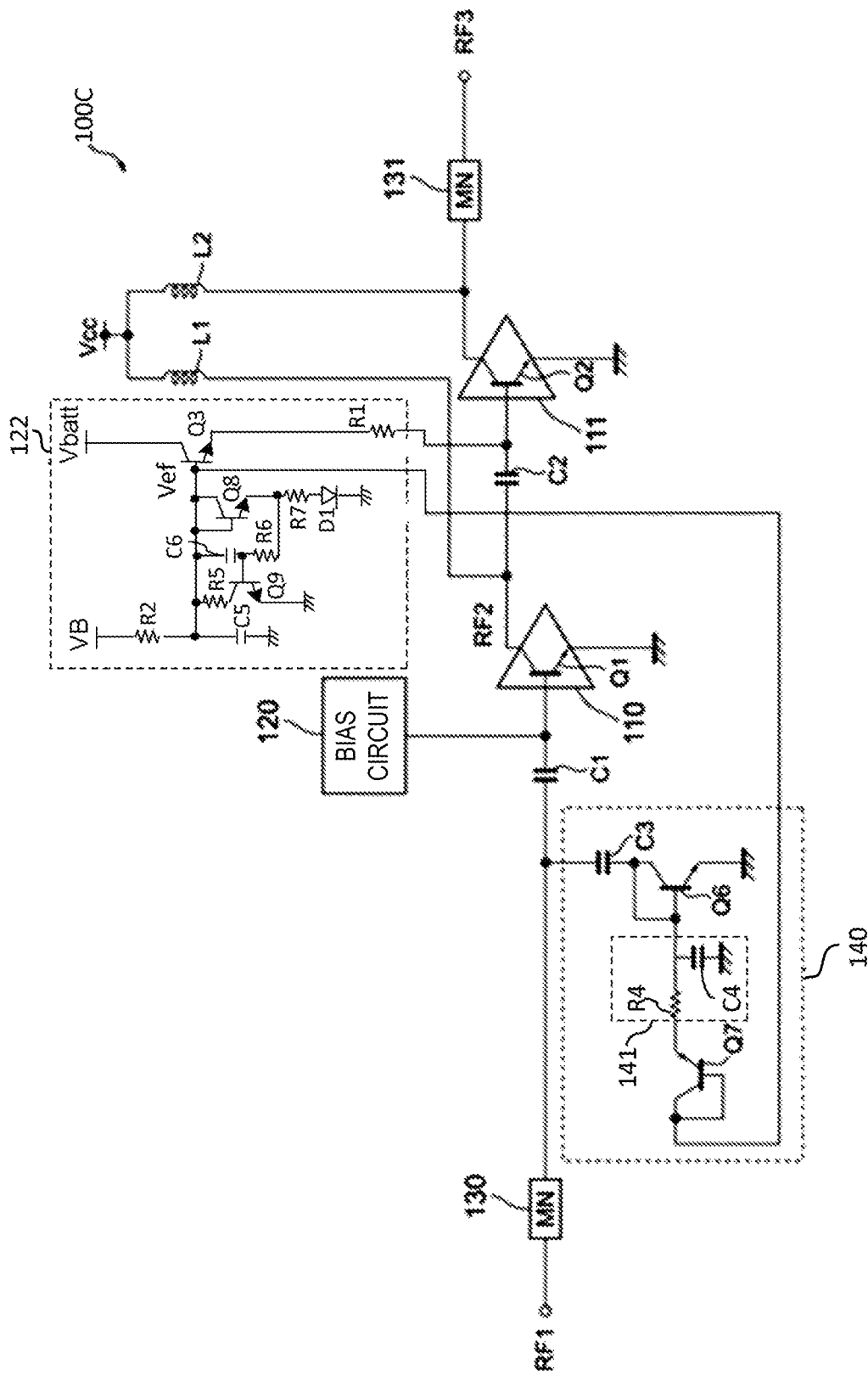
FIG. 6 illustrates an example of a configuration of another modification of the power amplifier circuit according to the first embodiment of the present disclosure.

FIG. 6 illustrates an example of a configuration of another modification of the power amplifier circuit according to the first embodiment of the present disclosure. Hereinafter, a point in which the configuration of a power amplifier circuit 100C serving as a modification differs from the configuration of the power amplifier circuit 100A described above will be described, and a description of a point in which the configuration of the power amplifier circuit 100C is similar to the configuration of the power amplifier circuit 100A is appropriately omitted.

As illustrated in FIG. 6, a bias circuit 122 of the power amplifier circuit 100C includes transistors Q3, Q8, and Q9, resistance elements R1, R2, R5, R6, and R7, capacitors C5 and C6, and a diode Dl. In the bias circuit 122, as in the bias circuit 121, a current supply line to the bias adjustment circuit 140 is connected to a base terminal of the emitter follower transistor Q3 that provides a bias current or a bias voltage to the base of the amplification-stage transistor Q2. In the bias circuit 122, however, the number of transistor stages connected to the resistance element R2 of a bias VB terminal is changed from two to one.

Figure 7:
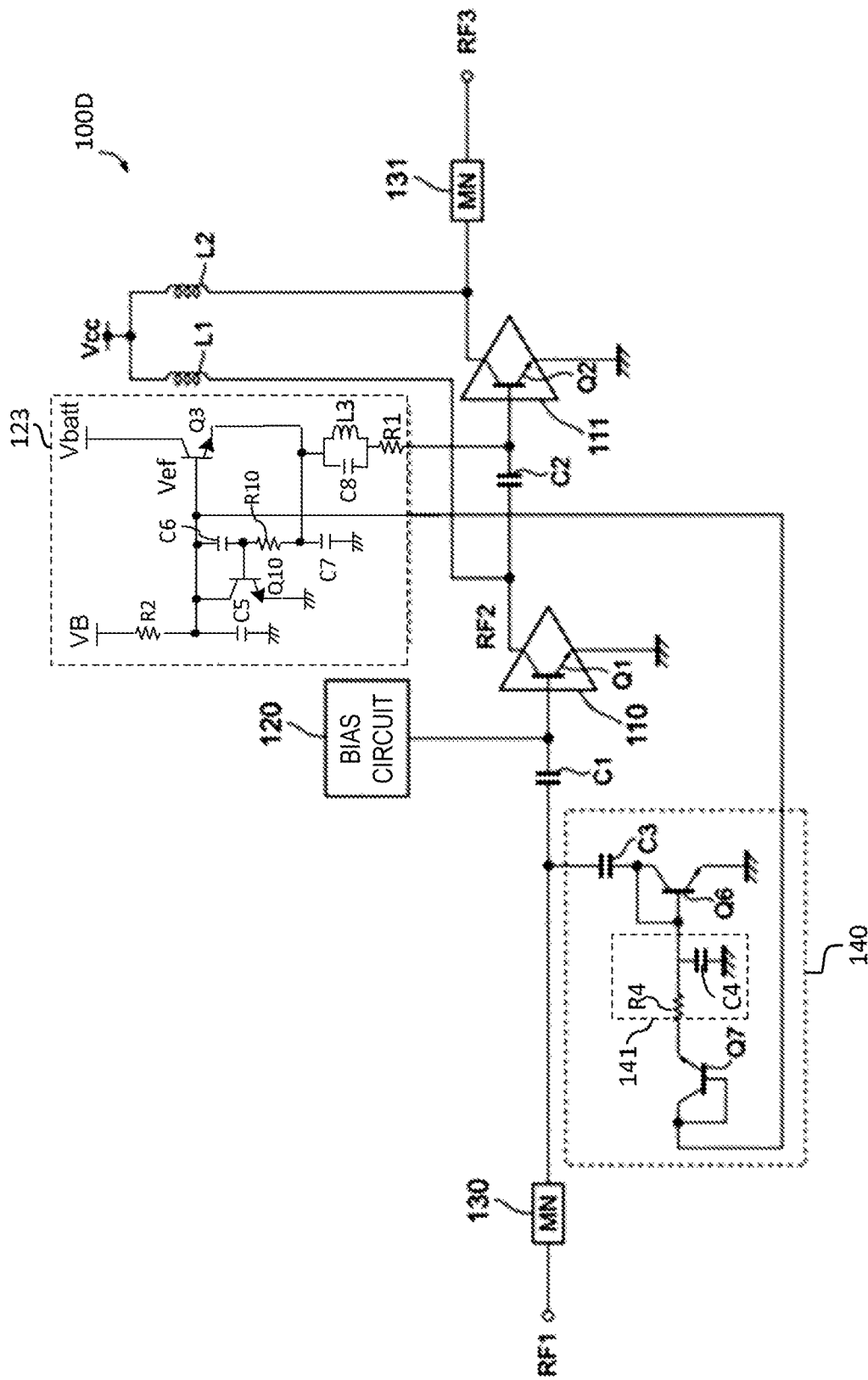
FIG. 7 illustrates an example of a configuration of still another modification of the power amplifier circuit according to the first embodiment of the present disclosure.

FIG. 7 illustrates an example of a configuration of still another modification of the power amplifier circuit according to the first embodiment of the present disclosure. Hereinafter, a point in which the configuration of a power amplifier circuit 100D serving as a further modification differs from the configuration of the power amplifier circuit 100A described above will be described, and a description of a point in which the configuration of the power amplifier circuit 100D is similar to the configuration of the power amplifier circuit 100A is appropriately omitted.

As illustrated in FIG. 7, a bias circuit 123 of the power amplifier circuit 100D includes transistors Q3 and Q10, resistance elements R1, R2, and R10, capacitors C5, C6, C7, and C8, and an inductor L3. In the bias circuit 123, as in the bias circuit 121, the current supply line to the bias adjustment circuit 140 is connected to the base terminal of the emitter follower transistor Q3 that provides a bias current or a bias voltage to the base of the amplification-stage transistor Q2. However, the bias circuit 123 differs from the bias circuit 121 in that, for example, a parallel capacitor is connected and an LC filter (capacitor C8 and inductor L3) is employed as a supply bias line to the resistance element R1.

The embodiment according to the present disclosure has been described above. A power amplifier circuit according to the first embodiment includes a first transistor that amplifies a first signal and outputs a second signal; a second transistor that amplifies the second signal and outputs a third signal; a bias circuit that supplies a bias current to a base of the second transistor; and a bias adjustment circuit that adjusts the bias current to be supplied by the bias circuit by subjecting the first signal to detection. The bias adjustment circuit controls the bias current to be supplied to the base of the second transistor by drawing, from the bias circuit, a current of a magnitude corresponding to a magnitude of the first signal. The current increases as the magnitude of the first signal increases.

Thus, when the output power of the power amplifier circuit increases, a current corresponding to the magnitude of the output power is drawn from the bias circuit. As a result, the linearity of a phase of an output signal of the power amplifier circuit is improved.

Furthermore, in the power amplifier circuit according to the first embodiment, the bias circuit may include a third transistor having an emitter from which the bias current is outputted.

Thus, the linearity of a phase of an output signal is improved.

Furthermore, in the power amplifier circuit according to the first embodiment, the bias adjustment circuit may include a first diode having an anode connected to a side on which a supply path of the first signal to the first transistor is disposed and to a base side of the third transistor, and having a cathode connected to a ground side.

Thus, the linearity of a phase of an output signal is improved.

Furthermore, in the power amplifier circuit according to the first embodiment, the first diode may be a fourth transistor that has a collector connected to the side on which the supply path of the first signal to the first transistor is disposed, a base connected to the base side of the third transistor, and an emitter connected to the ground side, and that is diode connected.

Thus, the linearity of a phase of an output signal is improved.

Furthermore, in the power amplifier circuit according to the first embodiment, the bias adjustment circuit may further include a second diode having an anode connected to a base of the third transistor and a cathode connected to the anode of the first diode.

Thus, the linearity of a phase of an output signal is improved.

Furthermore, in the power amplifier circuit according to the first embodiment, the second diode may be a fifth transistor that has a collector connected to the base of the third transistor and an emitter connected to the anode of the first diode, and that is diode connected.

Thus, the linearity of a phase of an output signal is improved.

Furthermore, in the power amplifier circuit according to the first embodiment, the bias adjustment circuit may further include a filter circuit having one end connected to the anode of the first diode and another end connected to the base side of the third transistor.

Thus, of an input signal to the power amplifier circuit, the noise transferred to the bias circuit through the bias adjustment circuit is reduced. Hence, the linearity of a phase of an output signal is improved with high accuracy.

Furthermore, in the power amplifier circuit according to the first embodiment, the filter circuit may include a first capacitor having one end connected to the anode of the first diode and another end grounded, and a second resistance element having one end connected to the anode of the first diode and to the one end of the first capacitor, and having another end connected to the base side of the third transistor.

Thus, the linearity of a phase of an output signal is improved with high accuracy.

Furthermore, in the power amplifier circuit according to the first embodiment, the current may increase as the magnitude of the first signal increases.

Thus, the linearity of a phase of an output signal is improved.

The above-described embodiment is intended to facilitate understanding of the present disclosure, but is not intended for a limited interpretation of the present disclosure. The present disclosure can be changed or improved without departing from the gist thereof and includes equivalents thereof. That is, appropriate design changes made to the embodiment by those skilled in the art are also included in the scope of the present disclosure as long as the changes have features of the present disclosure. For example, the elements included in the embodiment, and the arrangements, materials, conditions, shapes, sizes, and so forth of the elements are not limited to those exemplified in the embodiment, and can be appropriately changed. Furthermore, the elements included in the embodiment can be combined with each other so long as it is technically possible to do so, and such combined elements are also included in the scope of the present disclosure as long as the combined elements have the features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
a first transistor configured to amplify a first signal and output a second signal;
a second transistor configured to amplify the second signal and output a third signal;
a bias circuit configured to supply a bias current to a base of the second transistor; and
a bias adjustment circuit configured to adjust the bias current supplied by the bias circuit by subjecting the first signal to detection,
wherein the bias adjustment circuit controls the bias current supplied to the base of the second transistor such that a magnitude of the bias current corresponds to a magnitude of the first signal,
wherein the bias current increases as the magnitude of the first signal increases, and
wherein the bias circuit includes
a first resistance element having one end to which a bias control voltage is supplied, and
a third transistor having a base connected to another end of the first resistance element and an emitter from which the bias current is outputted, and
wherein the bias adjustment circuit supplies, from the base of the third transistor, the bias current of the magnitude corresponding to the magnitude of the first signal.

2. The power amplifier circuit according to claim 1, wherein the bias adjustment circuit includes a first diode having an anode connected to a side on which a supply path of the first signal to the first transistor is disposed and to a base side of the third transistor, and having a cathode connected to a ground side.

3. The power amplifier circuit according to claim 2, wherein the first diode is a fourth transistor that has a collector connected to the side on which the supply path of the first signal to the first transistor is disposed, a base connected to the base side of the third transistor, and an emitter connected to the ground side, the fourth transistor being diode connected.

4. The power amplifier circuit according to claim 2, wherein the bias adjustment circuit further includes a second diode having an anode connected to the base of the third transistor and a cathode connected to the anode of the first diode.

5. The power amplifier circuit according to claim 3, wherein the bias adjustment circuit further includes a second diode having an anode connected to the base of the third transistor and a cathode connected to the anode of the first diode.

6. The power amplifier circuit according to claim 4, wherein the second diode is a fifth transistor that has a collector connected to the base of the third transistor and an emitter connected to the anode of the first diode, the fifth transistor being diode connected.

7. The power amplifier circuit according to claim 2, wherein the bias adjustment circuit further includes a filter circuit having one end connected to the anode of the first diode and another end connected to the base side of the third transistor.

8. The power amplifier circuit according to claim 3, wherein the bias adjustment circuit further includes a filter circuit having one end connected to the anode of the first diode and another end connected to the base side of the third transistor.

9. The power amplifier circuit according to claim 7, wherein the bias adjustment circuit further includes a second diode having an anode connected to the base of the third transistor and a cathode connected to the filter circuit.

10. The power amplifier circuit according to claim 7, wherein the filter circuit includes
a first capacitor having one end connected to the anode of the first diode and another end grounded, and
a second resistance element having one end connected to the anode of the first diode and to the one end of the first capacitor, and having another end connected to the base side of the third transistor.

11. The power amplifier circuit according to claim 7, wherein the bias adjustment circuit further includes a second diode having an anode connected to the base of the third transistor and a cathode connected to the filter circuit, and
wherein the filter circuit includes
a first capacitor having one end connected to the anode of the first diode and another end grounded, and
a second resistance element having one end connected to the anode of the first diode and to the one end of the first capacitor, and having another end connected to the cathode of the second diode.

12. A power amplifier circuit comprising:
a first transistor configured to amplify a first signal and output a second signal;
a second transistor configured to amplify the second signal and output a third signal;
a bias circuit configured to supply a bias current to a base of the second transistor; and
a bias adjustment circuit configured to adjust the bias current supplied by the bias circuit by subjecting the first signal to detection,
wherein the bias adjustment circuit controls the bias current supplied to the base of the second transistor such that a magnitude of the bias current corresponds to a magnitude of the first signal,
wherein the bias current increases as the magnitude of the first signal increases, and
wherein the bias circuit includes
a resistance element connected in series with an inductor and a second capacitor, the inductor and the second capacitor being connected in parallel to each other.

13. The power amplifier circuit according to claim 12, wherein one end of the resistance element is connected to the inductor and the second capacitor connected in parallel to each other, and another end of the resistance element is connected to the base of the second transistor.

14. The power amplifier circuit according to claim 12, wherein the inductor and the second capacitor connected in parallel to each other are connected to an emitter of a third transistor.

\* \* \* \* \*